(12) United States Patent
Ohashi et al.

(10) Patent No.: US 8,109,752 B2
(45) Date of Patent: Feb. 7, 2012

(54) IMPRINTING STAMPER AND METHOD OF MANUFACTURING THE SAME

(75) Inventors: Kenya Ohashi, Hitachinaka (JP); Masahiko Ogino, Hitachi (JP); Akihiro Miyauchi, Hitachi (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 563 days.

(21) Appl. No.: 12/146,489

(22) Filed: Jun. 26, 2008

(65) Prior Publication Data

US 2009/0004320 A1    Jan. 1, 2009

(30) Foreign Application Priority Data

Jun. 29, 2007 (JP) .................................. 2007-171415

(51) Int. Cl.
  *B29C 59/00* (2006.01)
(52) U.S. Cl. ........................................ 425/385; 264/293
(58) Field of Classification Search ............ 425/385; 264/293
  See application file for complete search history.

(56) References Cited

U.S. PATENT DOCUMENTS

| 5,817,242 | A | * | 10/1998 | Biebuyck et al. | ............... 216/41 |
| 7,195,733 | B2 | * | 3/2007 | Rogers et al. | ............... 264/496 |
| 2005/0133954 | A1 | | 6/2005 | Homola | |
| 2006/0279025 | A1 | | 12/2006 | Heidari et al. | |

FOREIGN PATENT DOCUMENTS

JP    2005-183985    7/2005

OTHER PUBLICATIONS

MIT Materials Database for PMMA and PDMS; updated 2010.*

* cited by examiner

*Primary Examiner* — Maria Veronica Ewald
(74) *Attorney, Agent, or Firm* — Antonelli, Terry, Stout & Kraus, LLP.

(57) ABSTRACT

An imprinting stamper which can transfer a microscopic pattern to a medium bearing a convex area or local projection, with high accuracy. A convexo-concave pattern is formed on a surface of the imprinting stamper. It includes a pattern layer having the convexo-concave pattern; and a stamper backside layer arranged on a backside of the pattern layer. Young's modulus of the pattern layer is 500 MPa to 10 GPa; and Young's modulus of the stamper backside layer is smaller than Young's modulus of the pattern layer.

9 Claims, 6 Drawing Sheets

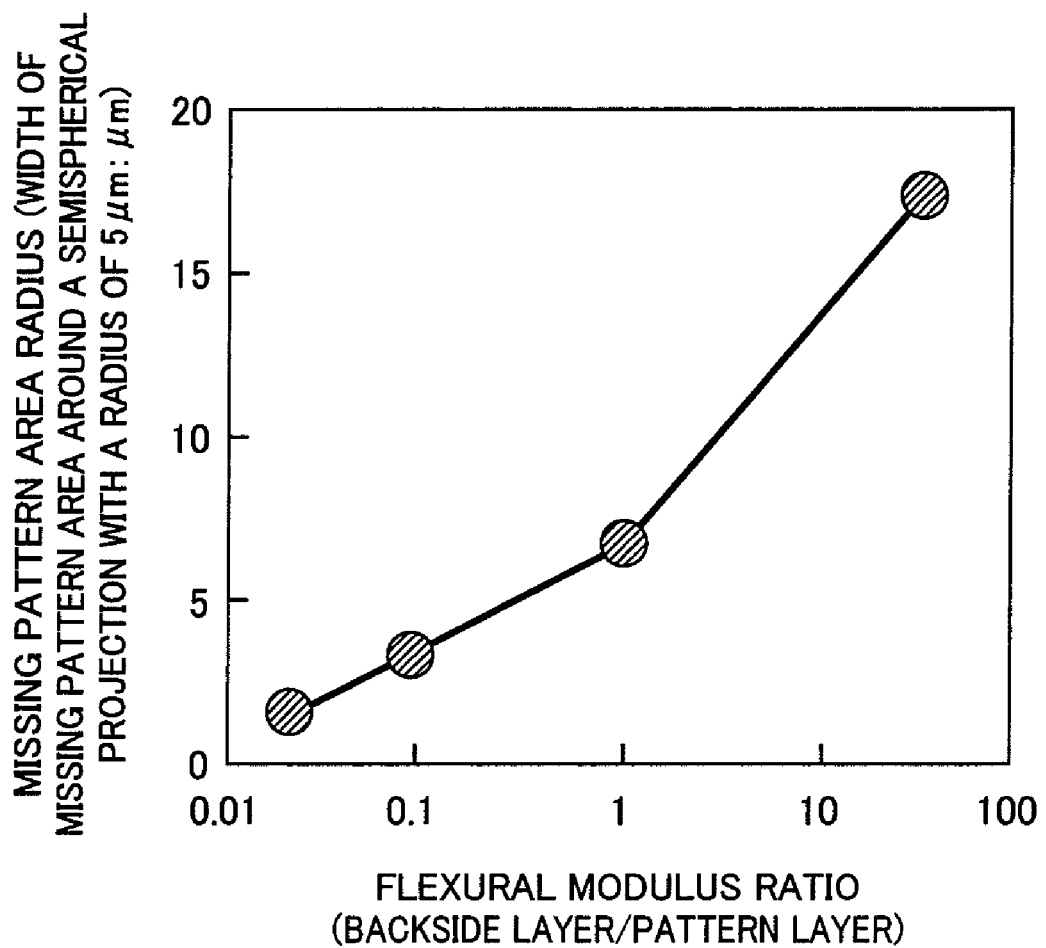

US 8,109,752 B2

IMPRINTING STAMPER AND METHOD OF MANUFACTURING THE SAME

CLAIM OF PRIORITY

The present application claims priority from Japanese patent application serial No. 2007-171415, filed on Jun. 29, 2007, the content of which is hereby incorporated by reference into this application.

BACKGROUND OF THE INVENTION

1. Field of the Invention

The present invention relates to an imprinting stamper and a method of manufacturing the same.

2. Description of Related Art

In the known process of manufacturing semiconductor devices, photolithographic technology has often been used to form a microscopic pattern. While the tendency toward microscopic patterns grows, this approach has a problem that pattern sizes are restricted by the wavelength of light used for exposure and higher positioning accuracy is required, resulting in higher equipment cost. On the other hand, as technology for high precision patterning at low cost, nano-imprint technology has been known in which a specific desired pattern is transferred to a resist film layer formed on a substrate surface by stamping with a stamper with the same convexo-concave pattern as the desired pattern.

FIGS. 5A to 5F schematically show an example of the process of forming a microscopic pattern using nano-imprint technology. In this example, as shown in FIG. 5A, a substrate 503 coated with patterning resin 502 as a medium on which a transfer is made, and a mold 501 are fixed on a stage (not shown) which can control the distance between them. Next, as shown in FIG. 5B, the convexo-concave pattern of the mold 501 is transferred to the resin 502 by moving the stage and pressing the mold 501 against the resin 502. At this moment, resin remains in the concave parts of the resin 502. The remaining resin in the concave parts is removed by anisotropic reactive ion etching (RIE) or a similar technique until the pattern concave parts of the substrate 503 are exposed. The resin pattern thus created may be used as follows. For example, after etching the exposed parts of the substrate 503 as shown in FIG. 5C, grooves as shown in FIG. 5D can be made by removing the resin 502. Another possible example is that after a metal layer 504 is formed on the entire surface of the transfer medium as shown in FIG. 5E, the resin 502 is removed to make a structure with a specific pattern as shown in FIG. 5F.

This nano-imprint technology has a problem that the existence of micron-order waves on the stamper or substrate surface may hamper high precision transfer of a microscopic pattern. One possible solution to this problem is that an elastomer layer is made on the backside of the stamper to distribute the imprinting pressure evenly to enable the stamper to accommodate the wavy surface of the substrate (for example, see Patent Document 1).

Patent Document 1: Japanese Patent Laid-open No. 2005-183985 (US 2005/0133954 A1)

The elastomer layer on the backside of the stamper as described in Patent Document 1 makes it possible to transfer a microscopic pattern while accommodating a wavy surface of the stamper or substrate. However, some substrates locally have foreign bodies or projections of 2-10 μm in diameter and/or height. The stamper of a hard material with an elastomer layer on its backside as described above cannot accommodate such local projections, resulting in an imperfect pattern or a transfer defect where some part of the pattern is missing in the transfer made.

Besides, in a convexo-concave pattern formed by nano-imprint technology, resin film (remaining film) is left beneath concave parts. In order to use this convexo-concave pattern as a mask in processing a substrate, the remaining film is removed because it is unwanted. For a higher substrate processing accuracy, the thickness of the remaining film must be decreased to several dozen nanometers or less. In creation of a pattern with a thin remaining film, the above problem of local projections is more serious. Therefore, in the imprint technology for forming microscopic patterns with high accuracy, if a stamper made of a hard material such as silicon, quartz or metal should be used as in the past, it would be unavoidable to produce imperfectly transferred pattern areas on a projection-bearing substrate.

The present invention has been made in view of the above problem and has an object to provide a stamper which accommodates local projections of a substrate and does not cause transfer defects.

SUMMARY OF THE INVENTION

As a result of intensive studies, the present inventors have found that when a stamper is made of a low-hardness resin and has a multilayer structure with different Young's moduli, the above problem can be overcome.

The present invention is characterized in that an imprinting stamper, on a surface of which a convexo-concave pattern is formed, includes a pattern layer made of a resin material in which the convexo-concave pattern is formed, and a stamper backside layer which is arranged on backside of the pattern layer. Here, Young's modulus of the pattern layer is 500 MPa to 10 GPa and Young's modulus of the stamper backside layer is smaller than Young's modulus of the pattern layer.

According to the present invention, it is possible to provide a stamper which can accommodate a local projection of a substrate for transfer with less transfer defects. Especially, because the stamper including the pattern layer made of the resin material can accommodate a projection smaller than micrometer scale on a surface of the substrate for transfer, an incomplete transfer area can be reduced.

BRIEF DESCRIPTION OF THE DRAWINGS

FIG. 2A shows a pre-transfer step, FIG. 2B shows transfer in progress, FIG. 2C shows completion of the transfer, and FIG. 2D shows that the stamper restores its original shape.

FIG. 3 is a graph showing the relation between missing pattern area size and Young's module ratio in a double-layer stamper.

FIG. 5A illustrates a mold for imprinting and a substrate, FIG. 5B shows pattern transfer in progress, FIG. 5C shows an etched substrate, FIG. 5D shows grooves formed in the substrate, FIG. 5E shows a metal layer formed on the substrate, and FIG. 5F shows a finished pattern.

DETAILED DESCRIPTION OF THE INVENTION

The present invention relates to an imprinting stamper and a method of manufacturing the same and more particularly to an imprinting stamper which transfers a microscopic pattern to a medium having a convex part like a projection.

Figure 1:
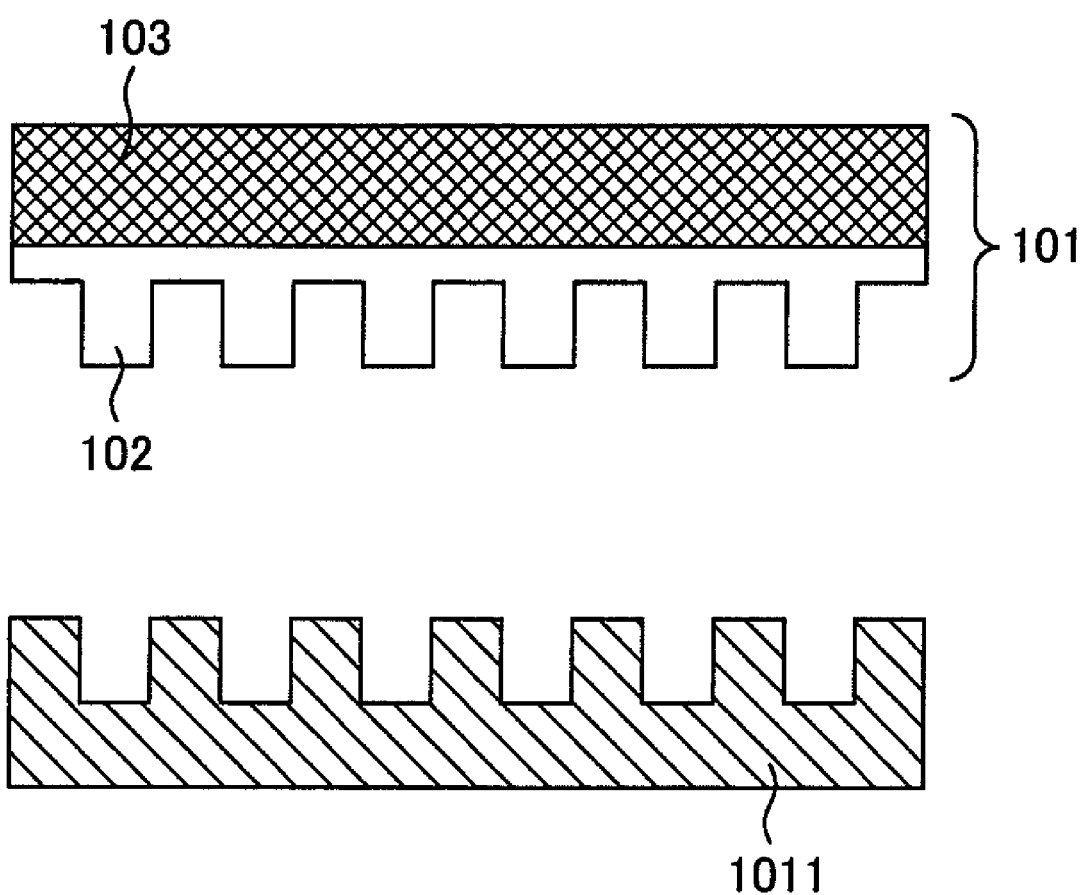
FIG. 1 is a sectional view of a stamper structure according to the present invention and a resin to which a pattern is transferred.

FIG. 1 is a sectional view of a stamper according to the present invention. In the present invention, the stamper 101 includes a pattern layer 102 in which a convexo-concave pattern is formed and a stamper backside layer 103 which is arranged on the back of the pattern layer 102. The pattern layer 102 is made of a rigid resin which does not deform under transfer pressure. It is preferable that flexural modulus of the pattern layer 102, or Young's modulus, be 500 MPa to 10 GPa. If the Young's modulus should be smaller than 500 MPa, deformation of the pattern layer would occur under transfer pressure, making it difficult to transfer a pattern accurately. If the Young's modulus should be larger than 10 GPa, characteristics to accommodate local projections would deteriorate and transfer defects would be more likely to occur in projection-bearing areas.

The stamper backside layer 103 is made of a material with a Young's modulus smaller than that of the pattern layer 102 so as to encourage the stamper to deform to accommodate local projections. It is preferable that the Young's modulus of the stamper backside layer 103 be not larger than 400 MPa. In order to improve the ability to accommodate local projections, it is preferable that the stamper backside layer 103 be thicker than the pattern layer 102 and the thickness of the pattern layer 102 be 100 nm to 50 μm. If the stamper backside layer 103 should be thinner than the pattern layer 102, the effect of stamper deformation would be small and a sufficient ability to accommodate local projections would not be obtained. If the thickness of the pattern layer 102 should be more than 50 μm, the ability to accommodate projections would decline and pattern transfer accuracy would deteriorate.

According to the present invention, local projections can be accommodated and the stamper's convexo-concave surface can accommodate local projections of a substrate so that transfer defects can be substantially reduced where the stamper has a multilayer structure including a rigid pattern layer which does not deform under transfer pressure and a stamper backside layer which has a Young's modulus smaller than that of the pattern layer and can deform.

Next, preferred embodiments of the invention will be described in detail.

First Embodiment

A preferred embodiment of the invention will be described below, focusing on the stamper structure and the method of manufacturing the stamper.

FIG. 1 is a sectional view of a stamper according to the present invention. For easy understanding, the pattern layer size is partially enlarged in the figure. The stamper 101 has a double-layer structure composed of a pattern layer 102 and a stamper backside layer 103 which are different in elasticity, where the pattern layer 102 bears a microscopic pattern. The microscopic pattern of the pattern layer 102 is transferred to the resin 1011 to form a microscopic pattern as an inversion of it therein. The materials of the stamper 101 are resins which are elastic enough to allow it to deform. The pattern layer 102 is made of a rigid resin which does not deform under transfer pressure; in this embodiment, it is a polyimide resin with a Young's modulus of 5 GPa. The stamper backside layer 103 is made of a low-elasticity resin which allows the stamper to deform to accommodate a local projection; in this embodiment, it is a silicone resin.

Figure 6A:
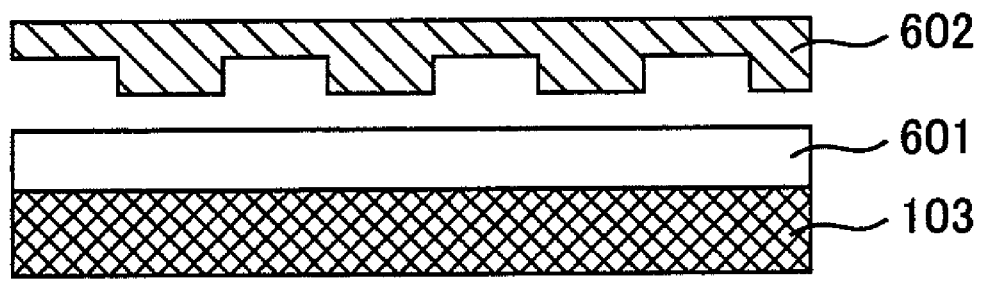
FIGS. 6A and 6B schematically show an example of a method of manufacturing a stamper according to the present invention.
Figure 6B:
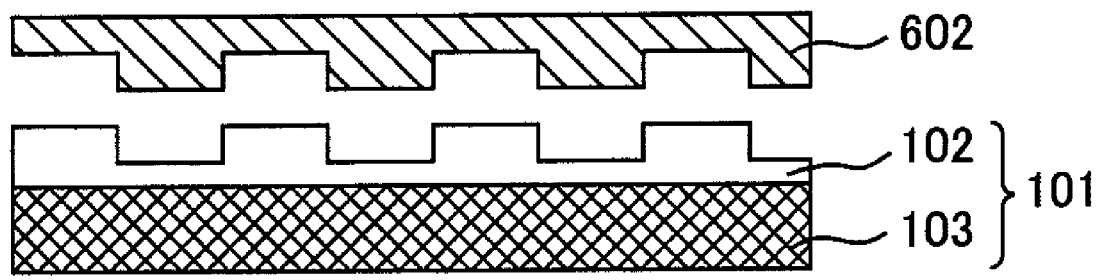

Next, a stamper manufacturing method according to this embodiment will be explained by using FIG. 6. Silicone resin film to become the stamper backside layer 103, a powder layer 601 including polyimide oligomer powder to become the polyimide of the pattern layer 102, and a master mold 602 with a microscopic convexo-concave surface are placed in the order of mention and heated in a vacuum pressure (a reduced pressure) at a melting temperature of the polyimide oligomer or higher and pressurized to accelerate the reaction of the polyimide oligomer and cure it. After that, the powder layer 601 and the master mold 602 are separated to get a stamper 101 which has a double-layer structure composed of a pattern layer 102 and a stamper backside layer 103. The polyimide oligomer powder is an example of a thermosetting resin.

If the adhesion between the pattern layer 102 and the stamper backside layer 103 is insufficient, it is desirable to treat the stamper backside layer's surface with a silane coupling agent or the like in advance in order to increase its adhesion to the pattern layer. Although oligomer powder is used for the pattern layer in this embodiment, instead a film resin material may be used to form a pattern. If the same resin is used for the pattern layer and stamper backside layer, it is possible to make a double-layer structure by thermally treating the surface for formation of a convexo-concave pattern to increase the Young's modulus of the pattern surface by heat curing.

Next, a transfer process using the stamper according to this embodiment will be explained.

Figure 2A:
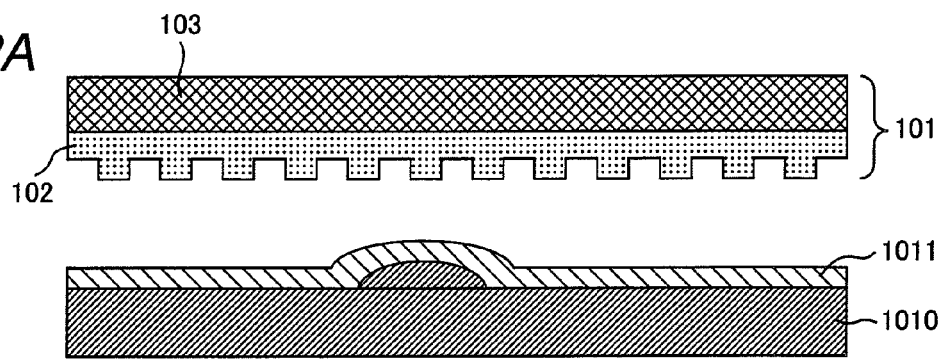
FIGS. 2A to 2D explain a pattern transfer process according to the present invention, where
Figure 2B:
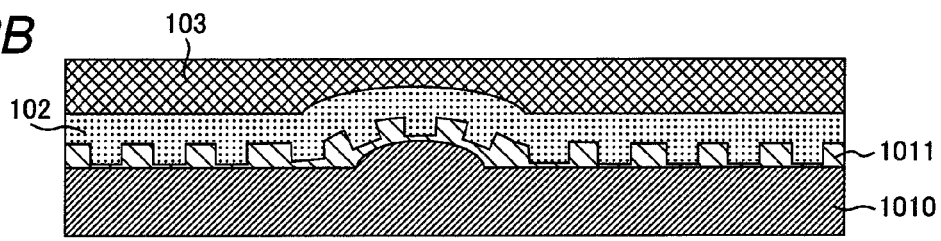
Figure 2C:
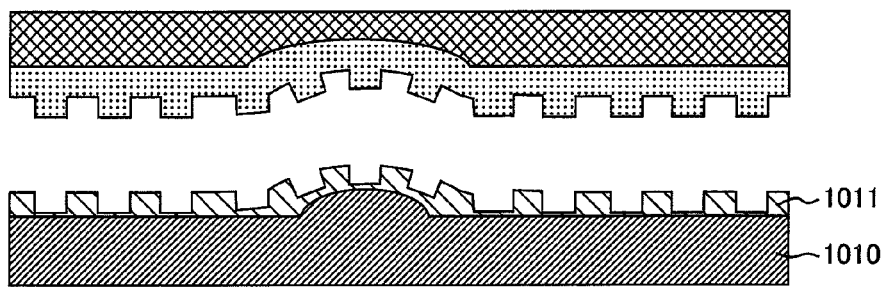
Figure 2D:
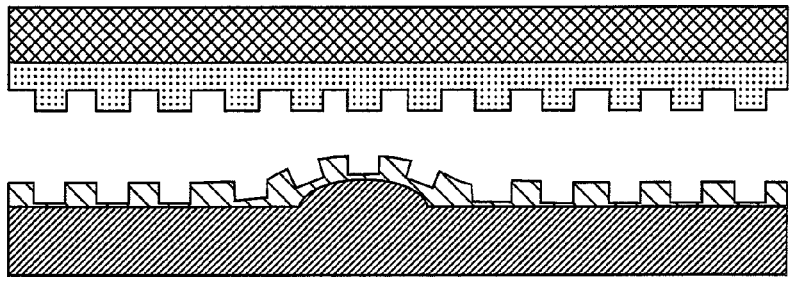

FIGS. 2A to 2D are sectional views of the stamper according to the present invention and a medium to which a pattern is transferred, showing the transfer process. FIG. 2A shows a pre-transfer step, specifically the stamper 101 and the resin 1011 before they contact each other. In this step, the stamper 101 is flat with the stamper backside layer 103 in contact with the back of the pattern layer 102. As the medium to which the pattern is to be transferred, the resin 1011 has, in its center, a projection which is similar to that of the substrate and supposed to contact the stamper 101 in advance of the rest of the resin surface. FIG. 2B shows that the stamper 101 and the resin 1011 contact each other and transfer is in progress by the pressure applied between the stamper and resin with the stamper 1011 deformed along the contour of the projection. In this step, two phenomena progress simultaneously: one phenomenon is the effect of the small Young's modulus of the stamper backside layer 103 to induce bending to accommodate the projection and the other is the effect of the large Young's modulus of the pattern layer 102 to curb deformation under pressure to keep the shape. Although the stamper 101 deforms along the contour of the projection, the pattern layer 102, a rigid resin with a large flexural modulus, does not deform under transfer pressure but keeps its convexo-concave shape. Consequently, the microscopic pattern of the stamper 101 is transferred to the resin surface including the projection area and an inverted pattern is formed on the resin surface including the projection area. FIG. 2C shows that the pattern transfer is finished and the resin 1011 is released from the stamper 101. An inverted pattern as an inversion of the pattern of the stamper 101 is transferred to the surface of the resin 1011 and the pattern is arranged even on the projection area in the center though some irregularity in shape is seen. If a stamper which less deforms is used, the stamper's pattern would not reach the area around the projection and produces an untransferred or missing pattern area. On the other hand, by using a stamper which can deform as mentioned above, the missing pattern area can be minimized. FIG. 2D shows that the stamper 101 leaves the resin 1011 and as time passes, it restores its original state as a flat plate from the deformed state while the resin 1011 keeps the formed microscopic pattern. As described above, the stamper thus prepared is used as follows: the stamper is made to contact the resin film formed on the surface of the substrate for pattern transfer and the convexo-concave pattern on the stamper surface is transferred. Therefore, a resin pattern for a complicated groove or structure can be formed even on a resin lying over a projection-bearing substrate by a transfer process at a time.

Although polyimide is used as the material of the pattern layer 102 in this embodiment, any of the following materials may be used instead as far as they have a flexural modulus almost as large as polyimide: phenol-formaldehyde resin, urea-formaldehyde resin, melamine-formaldehyde resin, unsaturated polyester resin, vinyl ester resin, epoxy resin, polyamide resin, ABS resin, methyl methacrylate resin, styrene copolymer resin, AAS resin, polyarylate resin, cellulose acetate, polypropylene, polyethylene phthalate, polybutylene terephthalate, polyphenylene sulfide, polyphenylene oxide, polystyrene, and polycarbonate. Although silicone resin is used as the material of the stamper backside layer 103 in this embodiment, any of the following materials may be used instead as far as they have a flexural modulus almost similar to that of silicone resin: alkyd resin, polyurethane resin, polyester resin, silicone resin, polytetrafluoroethylene resin, and diallylphthalate resin.

Second Embodiment

The second embodiment will be described in connection with evaluation of transferability depending on Young's modulus of the stamper pattern layer and Young's modulus of the stamper backside layer in the process of transferring a microscopic pattern to a resin layer lying over a projection-bearing substrate.

In an evaluation test according to this embodiment, a polyimide resin with a Young's modulus of 5 GPa was used for the stamper pattern layer. The backside materials used in the test are silicone resins whose flexural moduli are as small as 500 MPa and 200 MPa, polyimide (with the same Young's modulus), carbon steel (which was used for comparison because its Young's modulus is 200 GPa though it is not resin). A thickness of the pattern layer was 20 µm and thickness of the backside resin was 100 µm. FIG. 3 shows the result of size measurement of a missing pattern area of a microscopic pattern formed on a projection-bearing resin surface by the stampers, in relation to the Young's modulus ratio between the pattern layer and stamper backside layer as a main parameter. The minimum pattern element size is 500 nm and the resin projection is a semispherical projection with a radius of 5 µm and in the area around the projection, the stamper does not deform along the contour of the projection and some missing pattern area is produced in the resin. The missing pattern area is indicated by a concentric circle with a certain width around the projection. The widths of concentric circles produced by stampers with different flexural modulus (Young's modulus) ratios were measured. When the Young's modulus ratio is 1, the concentric circle (missing pattern area) width is 7 µm and when it is 50, the width is 18 µm. As the Young's modulus of the stamper backside layer is smaller, namely the backside is easier to bend than the pattern layer, the missing pattern area is smaller: at a Young's modulus of 0.1, the missing pattern area width is 3.5 µm and at a Young's modulus of 0.04, the width is 1.8 µm. This suggests that in the case of a double-layer stamper structure, when Young's modulus of the pattern layer is ten times or more larger than Young's modulus of the stamper backside layer, the transfer accuracy is substantially improved.

Further, although the stamper according to this embodiment has the structure that the minimum pattern element size is 500 nm, a stamper having a structure that the minimum pattern element size is 10 nm to 20 µm can also reduce the missing pattern area. That is to say, a stamper comprising the pattern layer having the convexo-concave pattern having a minimum pattern element size of 10 nm to 20 µm on the surface can reduce the missing pattern area. In the present invention, the minimum pattern element size is a size of the convexo-concave pattern on a surface of the stamper, that is to say, a width or a diameter of the convex part or the concave part.

Third Embodiment

Next, an explanation will be given of a method of making a plurality of transfers simultaneously by a transfer apparatus with a parallel plate type press mechanism using the stamper according to the present invention.

Figure 4:
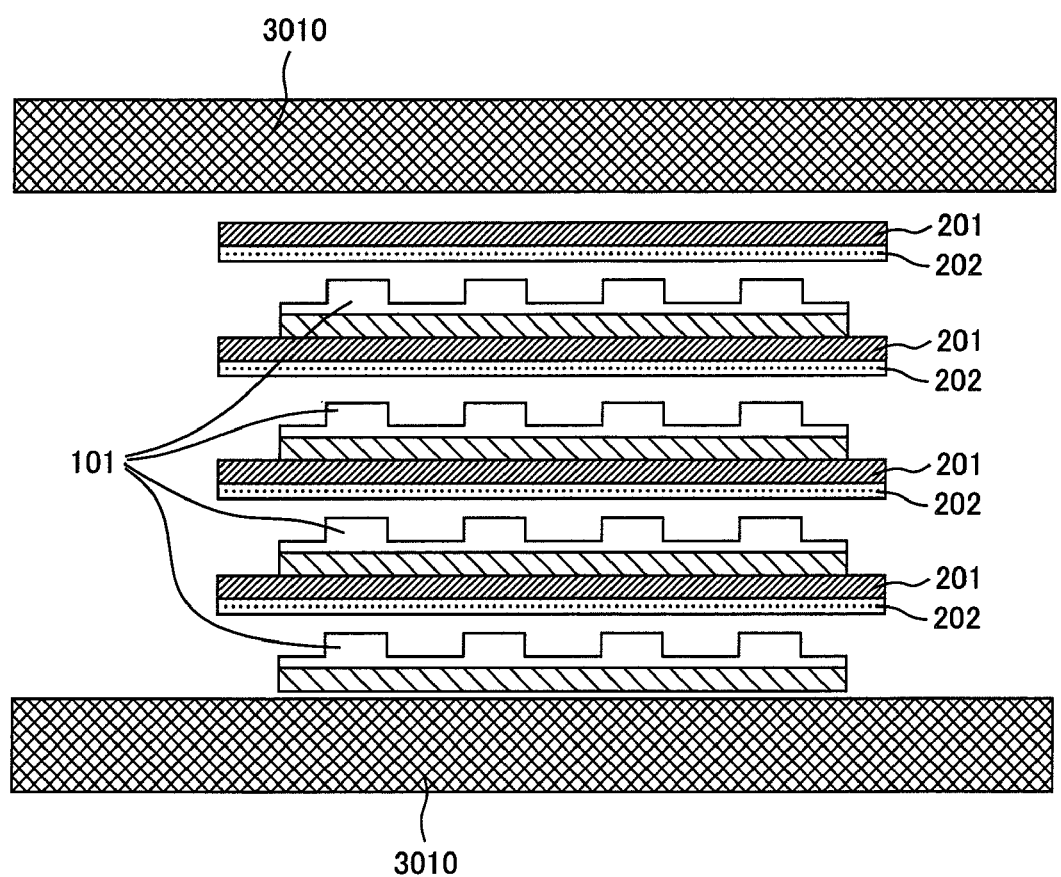
FIG. 4 illustrates the sectional structure of a press mechanism in which a plurality of transfers are made according to the present invention.
Figure 5A:
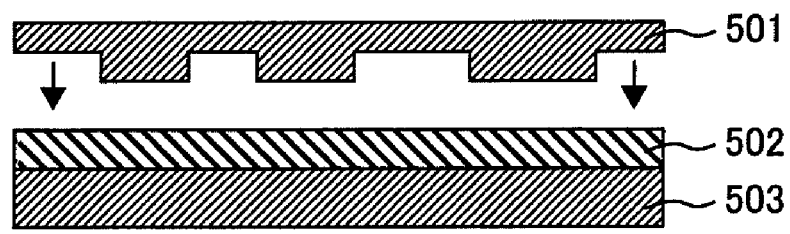
FIGS. 5A to 5F schematically show an example of a microscopic pattern forming process using nano-imprint technology, where
Figure 5B:
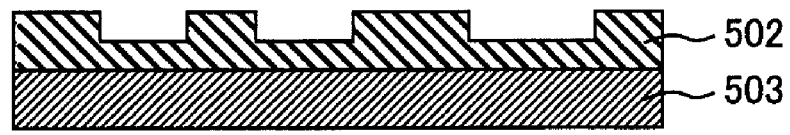
Figure 5C:
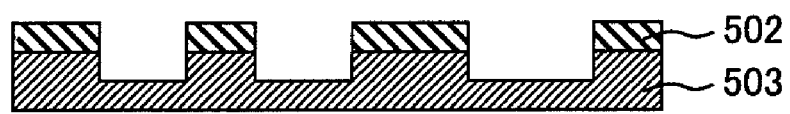
Figure 5D:
Figure 5E:
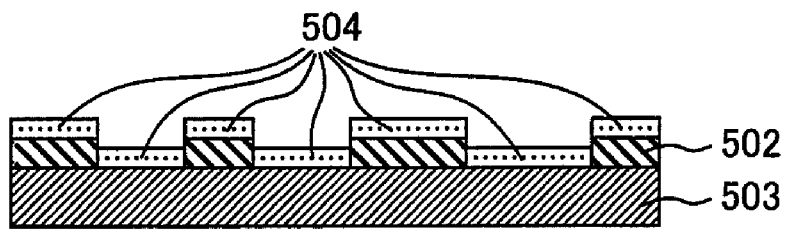
Figure 5F:
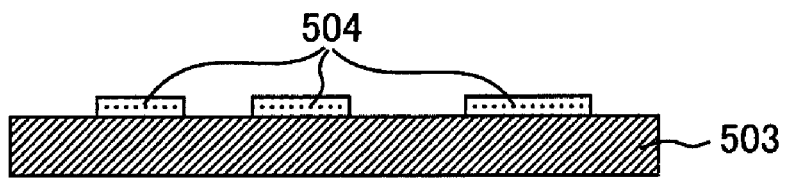

FIG. 4 shows that an upper and a lower parallel plate stage 3010, and double-layer stampers 101 and projection-bearing silicon substrates 201 coated with resin 202 which are placed between the stages 3010. A stamper 101 and a silicon substrate 201 coated with resin 202 constitute a set and four such sets are placed there. The upper and lower stages are brought closer to each other and after all the members contact neighboring ones, a pressure is continuously applied so that pressure transfers are made with an equal pressure applied to the four sets. In this process, the resin 202 surface bearing a projection similar to the projection of the substrate contacts the stamper which deforms along the contour of the resin and the microscopic pattern of the stamper 101 surface is transferred to the resin to form an inverted pattern therein. In this case, pattern layer of the stamper is made of polyimide resin with a Young's modulus of 5 GPa and its backside layer is made of silicone resin with a Young's modulus of 200 MPa. Although the polyimide resin is bonded to the silicone resin in this case, a similar effect can be achieved simply by bringing their whole surfaces into contact with each other.

As described above, the stampers thus prepared are used as follows: each stamper is made to contact the resin film formed on the surface of a substrate for pattern transfer and the convexo-concave pattern on the stamper surface is transferred. Therefore, a plurality resin patterns for a complicated groove or structure can be formed even on resins lying over projection-bearing substrates by a single transfer process.

According to the above embodiments, by using deformable multilayer stampers, patterns can be accurately transferred to resins bearing projections similar to the projections of projection-bearing substrates by a single transfer process while reducing missing pattern areas, so the manufacturing cost is lower and the pattern accuracy is higher than when the conventional photolithographic or imprint technique is used.

What is claimed is:

1. An imprinting stamper comprising:
a pattern layer having a convexo-concave pattern on a surface thereof; and
a stamper backside layer arranged on a backside of the pattern layer,
wherein the pattern layer and the stamper backside layer are composed of the same resin, Young's modulus of the pattern layer is 500 MPa to 10 GPa, and Young's modulus of the stamper backside layer is smaller than Young's modulus of the pattern layer.

2. The imprinting stamper according to claim 1, wherein the convexo-concave pattern has a minimum pattern element size of 10 nm to 20 μm on the surface.

3. The imprinting stamper according to claim 1, wherein Young's modulus of the pattern layer is ten times or more larger than Young's modulus of the stamper backside layer.

4. The imprinting stamper according to claim 1, wherein a thickness of the pattern layer is smaller than thickness of the stamper backside layer.

5. The imprinting stamper according to claim 4, wherein the thickness of pattern layer is 100 nm to 50 μm.

6. The imprinting stamper according to claim 1, wherein material of the pattern layer is one member selected from the group consisting of phenol-formaldehyde resin, urea-formaldehyde resin, melamine-formaldehyde resin, unsaturated polyester resin, vinyl ester resin, epoxy resin, polyimide resin, polyamide resin, ABS resin, methyl methacrylate resin, styrene copolymer resin, AAS resin, polyarylate resin, cellulose acetate, polypropylene, polyethylene phthalate, polybutylene terephthalate, polyphenylene sulfide, polyphenylene oxide, polystyrene, and polycarbonate.

7. The imprinting stamper according to claim 1, wherein material of the stamper backside layer is one member selected from the group consisting of alkyd resin, polyurethane resin, polyester resin, silicone resin, polytetrafluoroethylene resin, and diallylphthalate resin.

8. An imprinting stamper comprising:
a pattern layer having a convexo-concave pattern on a surface thereof; and
a stamper backside layer arranged on a backside of the pattern layer,
wherein the pattern layer and the stamper backside layer are made of the same resin, and Young's modulus of the pattern layer is larger than Young's modulus of the stamper backside layer.

9. The imprinting stamper according to claim 8, wherein Young's modulus of the pattern layer is ten times or more larger than Young's modulus of the stamper backside layer.

* * * * *